(12) United States Patent
Suzuki

(10) Patent No.: US 7,186,497 B2
(45) Date of Patent: Mar. 6, 2007

(54) DEVELOPER COMPOSITION FOR LITHOGRAPHIC PRINTING PLATE

(75) Inventor: Toshitsugu Suzuki, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 9 days.

(21) Appl. No.: 11/179,912

(22) Filed: Jul. 12, 2005

(65) Prior Publication Data

US 2005/0250058 A1    Nov. 10, 2005

Related U.S. Application Data

(62) Division of application No. 10/735,883, filed on Dec. 15, 2003, now abandoned.

(30) Foreign Application Priority Data

Dec. 24, 2002   (JP) .............................. 2002-371945

(51) Int. Cl.
    *G03F 7/30*      (2006.01)
(52) U.S. Cl. ...................... 430/300; 430/302; 430/322; 430/327

(58) Field of Classification Search ................ 430/300, 430/302, 322, 327
    See application file for complete search history.

(56) References Cited

U.S. PATENT DOCUMENTS

| | | | | |
|---|---|---|---|---|
| 4,816,384 A | * | 3/1989 | Fruge et al. | 430/465 |
| 5,798,204 A | * | 8/1998 | Fukui et al. | 430/399 |
| 5,900,352 A | * | 5/1999 | Elsaesser et al. | 430/331 |
| 5,914,221 A | * | 6/1999 | Kim et al. | 430/466 |
| 6,365,330 B1 | * | 4/2002 | Leichsenring et al. | 430/331 |
| 6,686,126 B2 | * | 2/2004 | Tsuchiya et al. | 430/302 |

* cited by examiner

*Primary Examiner*—Hoa Van Le
(74) *Attorney, Agent, or Firm*—Lucas & Mercanti, LLP

(57) ABSTRACT

A developer composition for a lithographic printing plate comprising on an aluminum plate support a photosensitive layer which comprises an ethylenically unsaturated monomer, a photopolymerization initiator and a polymeric binder is disclosed, wherein the developer composition contains water in an amount of not more than 10% by weight and is substantially free from a silicate. There is also disclosed a developer solution obtained by dissolving the developer composition in water.

9 Claims, No Drawings

DEVELOPER COMPOSITION FOR LITHOGRAPHIC PRINTING PLATE

CROSS REFERENCE TO RELATED APPLICATIONS

This Application is a Divisional Application of U.S. patent application Ser. No. 10/735,883, filed Dec. 15, 2003 now abandoned which, in turn, claim the priority of Japanese Application JP2002-371945, filed Dec. 24, 2002, the priority of which is also claimed herein.

FIELD OF THE INVENTION

The present invention relates to a developer composition for lithographic printing plates.

BACKGROUND OF THE INVENTION

Alkali metal silicate developers have been extensively used to develop photosensitive lithographic printing plates. In the photosensitive layer of a conventional photosensitive lithographic printing plate, ortho-quinoneazide compounds are used in combination with novolak resin and an aqueous alkaline silicate solution capable of dissolving novolak resin is used as a developer. A developer has a pH of about 13 to dissolve the novolak resin of the photosensitive layer so that silicates exhibiting superior buffer capacity at a pH near 13 have been allowed to be contained in the developer to enhance stability, as described in, for example, JP-A No. 8-160633 (hereinafter, the term, JP-A refers to Japanese Patent Application Publication).

Such a developer is liquid and so heavy, imposing a burden on the person handling them so that there have been widely proposed concentrated developers having a reduced water content. However, silicate-containing developers tend to easily solidify with reduction of the water content and even when re-diluted with water again, it is not easily dissolved in water, leading to insufficient concentration. To overcome such a problem, solidifying the silicate-containing developer in a granular form was proposed, as described in JP-A Nos. 5-142786 (pages 1–8), 6-266062 (pages 1–5) and 7-13341 (page 8). However, it was difficult to achieve stable solidification of the silicate, resulting in increased manufacturing costs and being of no practical advantage.

In a photopolymerization type photosensitive layer containing ethylenically unsaturated compounds, as represented by a photopolymer type CTP plate, on the other hand, novolak resin is not generally used, making it possible to design a developer at a pH of less than 12.5 and it has also no need to use a silicate as a pH buffer, rendering it possible to design a developer containing no silicate. In such developers described in the disclosure (for example, JP-A No. 2002-251019, page 34), there has not been proposed solidification of a developer component or a concentrate having a relatively high concentration factor. A developer for use in a photopolymer type CTP plate generally needs a higher developer-replenishing rate than conventional photosensitive lithographic printing plates which contain ortho-quinoneazide, and thus a lightweight developer has been desired.

SUMMARY OF THE INVENTION

It is an object of the present invention to provide a developer composition and a developer replenisher composition for a lithographic printing plate which are lightweight, easy-to-use and produces no problem such as being indissoluble when diluted with water.

The foregoing object of the invention can be achieved by the following constitution:

1. A developer composition for a lithographic printing plate comprising on the surface of an aluminum plate support a photosensitive layer of a photopolymerization type photosensitive resin composition which comprises an ethylenically unsaturated monomer, a photopolymerization initiator and a polymeric binder, wherein the developer composition has a water content of 10% by weight or less and the developer composition being substantially free from a silicate.
2. A developer solution for a lithographic printing plate comprising on an aluminum plate support a photosensitive layer which comprises an ethylenically unsaturated monomer, a photopolymerization initiator and a polymeric binder, wherein the developer solution is obtained by dissolving the developer composition described above in water.

Further, the present invention concerns a method for preparing a planographic printing plate using the developer solution described above. Thus, the method comprises imagewise exposing the lithographic printing plate described above and developing the exposed lithographic printing plate in the developer solution to obtain a planographic printing plate.

DETAILED DESCRIPTION OF THE INVENTION

The developer composition according to this invention may be prepared by forming a developer solution, followed by evaporation to dryness and is preferably prepared in such a manner that plural component materials are mixed with a small amount of water or without any water to make a concentrated material. Thus, the developer composition may be in the form of a paste or a powdery mixture. The developer composition can also be prepared in the form of granules or tablets, as described in JP-A Nos. 51-61837, 2-109042, 2-109043, 3-39735, 5-142786, 6-266062 and 7-13341.

The developer composition may be divided into plural parts differing in material species or compounding ratio. The thus concentrated developer composition is used for development preferably by dissolving in or dilution with water to a prescribed concentration prior to development. In cases when the developer composition is used as a replenisher, it is preferred that the developer composition is dissolved in or diluted with water to a prescribed concentration, followed by being supplied to a developer working solution, whereby it is also feasible to supply a developer at a higher concentration than the prescribed one or, without being diluted to the prescribed concentration, to the developer working solution. When supplied at a higher concentration than the prescribed one or without being diluted to the prescribed concentration, water may be separately added in the same timing or in a different timing.

The developer composition according to this invention has a water content of not more than 10% by weight, and preferably not more than 1% by weight, based on the composition. The higher water content often causes problems such that developer components separate out in water, losing homogeneity or becomes liquid, making handling hard.

Component materials contained in a developer solution for conventional lithographic printing plates can be employed as a material for the developer composition and it is preferred to exclude a material which reacts at a water content of not more than 10% by weight and cannot be recovered even with dilution, a material having a large moisture content or a liquid material at ordinary temperature. For example, a silicate petrifies at a reduced water content and becomes hard to be solved.

The developer composition of this invention is substantially free from a silicate. Thus, the developer composition contains a silicate in an amount of not more than 0.5% (preferably 0%) by weight, based on the composition, in which the amount of the silicate is represented by equivalent converted to $SiO_2$, i.e., in terms of weight converted to $SiO_2$. The composition preferably contains no silicate. Silicates are generally comprised of silicon dioxide and metal oxide, represented by $xM_2O \cdot ySiO_2$. Silicates are derived from orthosilicate ($M_4SiO_4$), and metasilicate ($M_2SiO_3$), which may combine to form polysilicates. Specific examples of a silicate include sodium silicate, potassium silicate and ammonium silicate.

Accordingly, it is preferred to use carbonates, phosphates or organic acid salts in place of silicates.

Next, components of the developer composition of this invention will be explained. Unless otherwise noted, the explanation is for both the developer composition and developer replenisher concentrate relating to this invention. In cases when described as a developer, it refers to a developer solution or developer replenishing solution which can be obtained by dilution with a prescribed amount of water.

The developer composition or developer solution relating to this invention comprises an alkali reagent (alkali or alkaline material). Alkali reagents other than silicates are preferred, including inorganic and organic alkali reagents. Examples of an inorganic alkali reagent (or inorganic alkaline compound) include sodium tertiary phosphate, potassium tertiary phosphate, ammonium tertiary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonium hydroxide, and lithium hydroxide. Examples of an organic alkali reagent (or organic alkaline compound) include monomethhylamine, dimethylamine, trimethylamine, monoethylamine, diethylamine, triethylamine, monoisobutylamine, diisobutylamine, triisobutylamine, n-butylamine, monoethanolamine, diethanolamine, triethanolamine, monoisopropanolamine, diisopropanolamine, ethyleneimine, ethylenediamine, pyridine, and tetramethylammonium hydroxide.

The alkali reagents can be used alone or in combination thereof. An alkali reagent is used preferably in an amount giving a pH of 9 to 13.5 (more preferably 10.0 to 12.5) and an electric conductivity of 2 to 40 mS/cm (more preferably 3 to 30 mS/cm, and still more preferably 5 to 20 mS/cm) when used as a developer (or developer solution). A pH lower than the foregoing range results in no image-formation and a pH exceeding the foregoing range often causes over-development, leading to increased damages in development of exposed areas. A conductivity lower than the foregoing range usually renders difficult dissolution of photosensitive composition provided on the surface of an aluminum plate support, leading to stained printing. A conductivity exceeding the foregoing range results in an increased salt concentration, retarding dissolution of the photosensitive layer and resulting in layer residues in unexposed areas.

The developer composition according to this invention preferably contains a compound comprising a nonionic surfactant containing a polyoxyalkylene ether group, which is hereinafter also denoted a polyoxyalkylene ether compound. Addition of such a surfactant promotes dissolution of the photosensitive layer in the unexposed area and reduces penetration of a developer to the exposed area. Preferred surfactants which comprises a polyoxyalkylene ether group include a compound represented by the following formula (1):

$$R_1-O-(R_2-O)_n H \qquad \text{formula (1)}$$

wherein $R_1$ is an alkyl group having 3 to 15 carbon atoms, an aromatic hydrocarbon group having 6 to 16 carbon atoms or an aromatic heterocyclic group having 4 to 15 carbon atoms, each of which may be substituted (and examples of a substituent include an alkyl group having 1 to 20 carbon atoms, halogen atom such as Br, Cl or I, aromatic hydrocarbon group having 6 to 15 carbon atoms, aralkyl group having 7 to 17 carbon atoms, alkoxy group having 1 to 20 carbon atoms, alkoxy-carbonyl group having 2 to 20 carbon atoms and acyl group having 2 to 15 carbon atoms); $R_2$ is an alkylene group having 1 to 100 carbon atoms, which may be substituted (and examples of a substituent include an alkyl group having 1 to 20 carbon atoms and aromatic hydrocarbon group having 6 to 15 carbon atoms); and n is an integer of 1 to 100.

In the foregoing formula (1), the portion of $(R_2-O)_n$ may be comprised of a combination of two or three groups. Specific examples thereof include a random combination of an ethylene oxy group and a propyleneoxy group, an ethylene oxy group and an isopropyleneoxy group, an ethylene oxy group and butyleneoxy group, an ethylene oxy group and an isobutyleneoxy group, and their random or blocked linkage. Surfactants containing a polyoxyalkylene ether group, which may be used alone or in their combination, are added to a developer, preferably in an amount of 1 to 30%, and more preferably 2 to 20% by weight. A lesser addition amount lowers developability and an excessive amount results in increased damages in development, leading to reduced press life of the printing plate.

There may be incorporated other surfactants. Specific examples thereof include nonionic surfactants including polyoxyethylene alkyl ethers such as polyoxyethylene lauryl ether, polyoxyethylene cetyl ether and polyoxyethylene stearyl ether; polyoxyethylene alkylaryl ethers such as polyoxyethylene octylphenyl ether and polyoxyethylene nonylphenyl ether; polyoxyethylene alkyl esters such as polyoxyethylene stearate; sorbitan alkyl esters such as sorbitan monolaurate, sorbitan monostearate, sorbitan distearate and sorbitan trioleate; monoglyceride alkyl esters such as glycerol monostearate and glycerol monooleate: anionic surfactants including alkylbebzenesulfonates such as sodium dodecylbenzenesulfonate; alkylnaphthalenesulfonates such as sodium butylnaphthalenesulfonate, sodium pentylnaphthalenesulfonate, sodium hexylnaphthalenesulfonate and sodium octylnaphthalenesulfonate; alkylsulfates such as sodium laurylsulfate; alkyl sulfonates such as sodium dodecylsulfonate; sulfosuccinic acid esters such as sodium dilaurylsulfosuccinate: amphoteric surfactants including alkylbetaines such as laurylbetaine and allylbetaine; and amino acids. Of these surfactants, anionic surfactants such as alkylnaphthalenesulfonates are specifically preferred. These surfactants may be used alone on in their combination. These surfactants are preferably contained in an effective amount (in terms of solids) of 0.1 to 20% by weight.

In addition to the components described above, the developer composition of this invention may optionally contain additives such as an organic solvent, chelating agent, reducing agent, dye, pigment, water-softening agent, antiseptic agent and defoaming agent.

The developer composition used in this invention preferably contain various development stabilizers. Preferred examples thereof include a polyethylene glycol adduct of a sugar alcohol, tetraalkylammonium salts such as tetrabutylammonium hydroxide, phosphonium salts such as tetrabutylphosphonium bromide, and iodonium salts such as diphenyliodonium chloride, as described in JP-A No. 6-282079; anionic surfactants and amphoteric surfactants described in JP-A No. 50-51324; water-soluble cationic polymers described in JP-A No. 55-95946; water-soluble amphoteric polymer electrolytes described in JP-A No. 56-142528; alkylene glycol adducts of organic boron compounds described in JP-A No. 59-84241; polyoxyethylene-polyoxypropylene block polymer type water-soluble surfactants described in JP-A No. 60-111246; polyoxyethylene-polyoxypropylene-substituted alkylenediamine compounds described in JP-A No. 60-129750; polyethylene glycols having a weight-average molecular weight of 300 or more, described in JP-A No. 61-215554; fluorinated surfactants containing a cationic group described in JP-A No. 63-175858; water-soluble ethyleneoxide adducts obtained by addition of at least 4 mol of an ethyleneoxide to an acid or alcohol, as described in JP-A No. 2-39157; and water-soluble polyalkylene compounds.

The developer or developer replenishing solution used in this invention is optionally added with organic solvents. Such aorganic solvents are suitably selected from those exhibiting a solubility in water of about not more than 10% by weight (preferably not more than 5% by weight). Examples thereof include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyoxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine, and N-phenyldiethanolamine. The foregoing organic solvents are contained at 0.1 to 5% by weight of the total weight of a developer, preferably are substantially not contained, and more preferably not contained at all. Herein, the expression, substantially not contained means being 1% by weight or less.

The developer composition used in this invention is optionally added with a reducing agent. Such a reducing agent prevents staining of printing plates and is effective, specifically when developing a negative type lithographic printing plate containing a photosensitive diazonium salt compound. Preferred organic reducing agents include, for example, phenol compounds such as thiosalicylic acid, hydroquinone, metol, methoxyquinone, resorcin and 2-methylresorcin; and amine compounds such as phenylenediamine and phenylhydrazine. Preferred inorganic reducing agents include sodium, potassium and ammonium salts of inorganic acids such as sulfurous acid, hydrogensulfurous acid, phosphorous acid, hydrogenphosphorous acid, dihydrogenphosphorous acid, thiosulfuric acid, and dithionous acid. Of these reducing agents, a sulfite exhibits superior anti-staining effects. The reducing agent is contained in the developer working solution in an amount of 0.05 to 5% by weight.

The developer composition used in this invention may optionally be added with an organic carboxylic acid. Such an organic carboxylic acid is an aliphatic carboxylic acid and aromatic carboxylic acid having 6 to 20 carbon atoms. Specific examples of an aliphatic carboxylic acid include caproic acid, enathylic acid, caprylic acid, lauric acid, myristic acid, palmitic acid and stearic acid. Alkanoic acids having 8 to 12 carbon atoms is specifically preferred. There are also usable unsaturated fatty acids containing a double bond in the carbon chain or branched fatty acids. The aromatic carboxylic acid refers to a carboxyl-substituted benzene, naphthalene or anthracene ring compound and specific examples thereof include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, 1-hydroxy-2-naphthoic acid, 3-hydroxy-2-naphthoic acid, 2-hydroxy-1-naphthoic acid, 1^naphthoic acid, and 2-naphthoic acid. Of these, hydroxynaphthoic acids are effective. The foregoing aliphatic or aromatic carboxylic acid is used preferably in the form of a sodium salt, potassium salt or ammonium salt to enhance water-solubility. The amount of an organic carboxylic acid contained in a developer is not specifically limited. A content less than 0.1% by weight cannot achieve sufficient effects and a content more than 10% by weight not only achieves further enhanced effects but also inhibits dissolution of other compounds used in combination. Accordingly, the content is preferably 0.1 to 10%, and more preferably 0.5 to 4% by weight.

The developer composition used in this invention may be added with additives described below to enhance developability. Examples thereof include neutral salts such as NaCl, KCl and KBr described in JP-A No. 58-75152; complex salt such as $[Co(NH_3)_6]Cl_3$ described in JP-A No. 59-121336; amphoteric polymer electrolytes such as copolymer of vinylbenzyl trimethylammonium chloride and sodium acrylate, as described in JP-A No. 56-142258; organometallic surfactants containing metal such as Si and Ti, described in JP-A No. 59-75255; and organic boron compounds described in JP-A No. 59-84241. The developer or replenisher used in this invention may optionally contain an atiseptic, coloring agent, thickener, defoaming agent or water-softening agent. Examples of a defoaming agent include mineral oils, vegetable oils, alcohols, surfactants and silicone, as described in JP-A No. 2-244143. Examples of a water-softening agent include a polyphosphoric acid and its sodium, potassium and ammonium salts; aminopolycarboxylic acids such as ethylenediamine-tetraacetic acid, diethylenetriaminepentaacetic acid, ethylenediaminedisuccinic acid, methyliminodiacetic acid, β-alanineacetic acid, triethylenetetraminehexaacetic acid, hydroxyethylethylenediaminetriacetic acid, nitrilotriacetic acid, 1,2-diaminocyclohexanetetraacetic acid, 1,3-diamino-2-propanoltetraacetic acid and their sodium potassium and ammonium salts; aminotri(methylenephosphonic acid), ethylenediaminetetra(methylenephosphonic acid), diethylenetriaminepenta(methylenephosphonic acid), triethylenetetraminehexa(methylenephosphonic acid), hydroxyethylethylenediaminetri(metylenephosphonic acid), 1-hydroxyethane-1,1-diphosphonic acid and their sodium, potassium and ammonium salts. The optimum amount of such a water-softening agent is variable, depending on chelating ability, and hardness and the amount of hard water used. In general, the content thereof is 0.01 to 5% by weight, and preferably 0.01 to 0.5% by weight, based on the developer. A content less than the foregoing range does not achieve the intended effects and a content exceeding the foregoing range often adversely affects image portions, such as color-missing.

An automatic processor usable in this invention is provided preferably with a mechanism for automatically replenishing a developer replenishing solution at an intended replenishing rate to a developing tank, preferably with a mechanism for discharging a developer exceeding a prescribed quantity, preferably with a mechanism of automatically replenishing water at an intended amount to a developing tank, preferably with a mechanism of detecting passing plates, preferably with a mechanism of estimating the processed plate area based on detection of passing plates, preferably with a mechanism of controlling the replenishing rate of replenisher and/or water, and/or replenishing timing based on detection of passing plate and estimation of processing areas; preferably with a mechanism of controlling the developer temperature, preferably with a mechanism of detecting pH and/or conductivity of a developer, and preferably with a mechanism of controlling a replenishing rate of replenisher and/or water and/or replenishing timing based on the detected pH and/or conductivity. It is also preferred to provide a mechanism of diluting the developer composition of this invention with water or dissolving the developer composition in water, while stirring. In cases where the developing step is followed by a washing step, used washing water is usable as dilution water or to dissolve the developer composition.

An automatic processor used in this invention may be provided with a pre-processing section to allow the plate to be dipped into a pre-processing solution prior to development. The pre-processing section is provided preferably with a mechanism of spraying a pre-processing solution onto the plate surface, preferably with a mechanism of controlling the pre-processing solution at a temperature within the range of 25 to 55° C., and preferably with a mechanism of scrubbing the plate surface with a roller-type brush. Water and the like are employed as a pre-processing solution.

The plate which has been processed with a developer is post-processed with a rinsing solution containing a surfactant, a finisher mainly containing gum arabic or starch derivatives, or a protective gum solution. Post-processing of the lithographic printing plate relating to this invention can be performed by the combination of the foregoing post-processes. For example, after completion of development and washing, processing with a surfactant-containing rinsing solution or processing with a finisher solution is preferred in terms of the rinsing solution or finisher being less exhausted. Cascaded counter-current processing with a rinsing solution or a finisher is also a preferred embodiment. Post-processing is carried out using an automatic processor provided with a developing section and a post-processing section. Post-processing is performed by spraying a processing solution through a nozzle or by dipping the plate into a processing tank filled with a processing solution while being transported. There is also known a method in which, after development, a given amount of washing water is supplied to the plate surface to perform washing and waste liquor is reused as diluting water for the developer composition. Processing can be performed with replenishing the respective replenishing solutions to the respective processing solutions in accordance with processing volume or processing time. There is also applicable post-processing with substantially unused post-processing solution, a so-called a non-reusable processing system. The lithographic printing plate which has been subjected to the foregoing process is transferred to an offset printing machine used for printing.

Gum solution may be suitably added with acids or buffers to remove alkaline ingredients in the developer. Further, there may be added a hydrophilic polymer compound, chelating agent, lubricant, atiseptic and solubilizing agent. Inclusion of a hydrophilic polymer compound in the gum solution provides a function as a protecting agent to prevent the developed plate from flawing or staining.

Addition of a surfactant to the gum solution used in this invention improves the surface of the photosensitive layer. Usable surfactants include anionic surfactants and/or nonionic surfactants. Examples of anionic surfactants include fatty acid salts, abietic acid salts, hydroxyalkanesulfonates, alkanesulfonates, dialkylsulfosuccinates, straight chain alkylbebzenesulfonates, branched alktlbebzenesulfonates, alkylnaphthalenesulfonates, alkylphenoxypolyoxyethylene propylsulfonates, polyoxyethylene alkylsulfophenyl ether, polyoxyethylene aryl ether sulfonic acid salts, polyoxyethylene-naphthyl ether sulfonic acid salts, N-metyl-N-oleyl-taurine sodium salts, petroleum sulfonic acid salts, nitrated castor oil, sulfated tallow oil, fatty acid alkyl ester sulfuric acid ester salts, alkylnitrates, polyoxyethylene alkyl ether sulfuric acid ester salts, fatty acid monoglyceride sulfate ester salts, polyoxyethylene alkylphenyl ether sulfuric acid salts, alkylphosphate ester salts, polyoxyethylene alkyl ether phosphoric acid ester salts, polyoxyethylene alkylphenyl ether phosphoric acid ester salts, partially saponified styrene anhydrous maleic acid copolymer, partially saponified olefin-anhydrous maleic acid copolymer, and naphthalene-sulfonate formaline condensates. Of the foregoing, dialkyl-sulfosuccinates, alkylsulfates and alkylnaphthalenesulfonates are preferred.

Examples of nonionic surfactants include polyoxyethylene alkyl ethers, polyoxyethylene alkylphenyl ethers, polyoxyethylene-polyoxypropylene block polymers, polyoxyethylene aryl ethers, polyoxyethylene naphthyl ethers, polyoxyethylene polystyrylphenyl ethers, polyoxyethylene polyoxypropylene alkyl ethers, glycerin fatty acid partial esters, sorbitan fatty acid partial esters, pentaerythritol fatyy acid partial esters, propylene glycol monofatty acid esters, sugar fatty acid partial esters, polyoxuethylen sorbitan fatty acid partial esters, polyoxyethylene sorbitol fatty acid partial esters, polyethylene glycol fatty acid partial esters, polyglycerin fatty acid partial esters, polyoxyethylene-modified caster oils, polyoxyethylene grycerin fatty acid partial esters, fatty acid diethanolamides, N,N-bis-2-hydroxyalkylamines, polyoxyethylene alkylamine, triethanolamine fatty acid esters and trialkylamineoxides. Of the foregoing, polyoxyethylene alkylphenyl ethers and polyoxyethylene-polyoxypropylene block polymers are preferred. There are also usable fluorinated or silicone-type anionic or nonionic surfactants.

The foregoing surfactants may be in their combination. For example, a combination of at least two different anionic surfactants or a combination of at least one anionic surfactant and at least one nonionic surfactant is preferred. The surfactant content is not specifically limited and preferably 0.01 to 20% by weight of post-processing solution.

In addition to the foregoing ingredients, the gum solution used in this invention may contain polyhydric alcohols, alcohols or aliphatic hydrocarbons, as a wetting agent. Examples of preferred polyhydric alcohols include ethylene glycol diethylene glycol, triethylene glycol, propylene glycol, tetraethylene glycol, polyethylene glycol, glycerin, and sorbitol. Preferred alcohols include, for example, alkyl alcohols such as propyl alcohol, butyl alcohol, pentanol, hexanol, butanol, and octanol; and alcohols containing an aromatic ring, such as benzyl alcohol, phenoxyethanol, and phenylaminoethyl alcohol.

Such a wetting agent is contained in the composition preferably at 0.1 to 50%, and more preferably 0.5 to 3.0% by weight. The wetting agents may be used alone or in combination thereof.

There may be contained a variety of hydrophilic polymers for the purpose of enhancing film-forming ability. Any hydrophilic polymer which has been usable in gum solution is suitably usable. Examples thereof include gum Arabic, cellulose derivatives (e.g., carboxymethyl cellulose, carboxymethyl cellulose, methyl cellulose) and their modified compounds, polyvinyl alcohol and its derivatives, polyvinyl pyrrolidone, polyacrylamide and its copolymers, poly[(vinyl methyl ether)-co-(anhydrous maleic acid)], poly[(vinyl acetate)-co-(anhydrous maleic acid)], and poly[styrene-co-(anhydrous maleic acid)].

The gum solution relating to this invention is advantageously used within the acidic range of a pH of 3 to 6. Mineral acids, organic acids or inorganic salts are added to the post-processing solution to adjust the pH to the range of 3 to 6, preferably in an amount of 0.01 to 2% by weight. Mineral acids include, for example, nitric acid, sulfuric acid, phosphoric acid and metaphosphoric acid. Organic acids include, for example, citric acid, acetic acid, oxalic acid, malonic acid, p-toluenesulfonic acid, tartaric acid, malic acid, lactic acid, levulinic acid, phytic acid and organic phosphonic acid. Inorganic salts include, for example, magnesium nitrate, primary phosphate, secondary phosphate, nickel sulfate, sodium hexamethanate, and sodium tripolyphosphate. Mineral acids, organic acids and inorganic salts may be used alone or in combination thereof.

The gum solution may be added with antiseptics or defoaming agents. Examples of antiseptics include phenol and its derivatives, formaline, imidazole derivatives, sodium dehydroacetate, 4-isothiazoline-3-one derivatives, benzoisothiazoline-3-one, benzotriazole derivatives, amidinoguanine derivatives, quaternary ammonium salts, derivatives of pyridine, quinoline and guanine, diazine, triazole derivatives, oxazole, and oxazine derivatives. A preferred content is a quantity capable of taking stable effect upon bacteria, mold or yeast, depending on the kind of bacteria, molds or yeast. The content is preferably 0.01 to 4% by weight, based on a plate surface protecting agent (or surface protectant). Two or more antiseptic are preferably used in combination to take effects upon various kinds of bacteria or molds. Silicone defoaming agents are preferred, and any one of emulsion type and solubilization type is usable. A defoaming agent is used suitably at 0.01 to 1.0% by weight, based on the gum solution used.

Further, there may be added chelating agents. Preferred chelating agents include, for example, ethylenediaminetetraacetic acid and its sodium and potassium salts, diethylenetriaminepentaacetic acid and its sodium and potassium salts, triethylenetetraminehexaacetic acid and its sodium and potassium salts, ethylenediaminedisuccinic acid and its sodium and potassium salts, hydroxyethylethylenediaminetriacetic acid and its sodium and potassium salts, nitrilotriacetic acid and its sodium and potassium salts, and organic phosphonic acids or phosphonoalkanecarboxylic acids, such as 1-hydroxyethane-1,1-diphosphonic acid and its sodium and potassium salts, aminotri(methylenephosphonic acid) and its sodium and potassium salts. Besides the foregoing sodium and potassium salts of chelating agents, organic amine salts are also effective. Chelating agents are selected from those which can be stably present in the gum solution composition and is free from adverse effects on printing. The content thereof is preferably 0.001 to 1.0% by weight, based on the gum solution used.

In addition to the foregoing ingredients, a lipophilicity-enhancing agent may be incorporated. Examples thereof include hydrocarbons such as turpentine oil, xylene, toluene, low heptane, solvent naphtha, kerosene, mineral spirit, petroleum fractions exhibiting a boiling point of ca. 120 to 250° C.; and plasticizers exhibiting a freezing point of 15° C. or less and a boiling point of 300° C. or more at 1 atmospheric pressure, including phthalic acid diesters such as dibutyl phthalate, diheptyl phthalate, di-n-octyl phthalate, di(2-ethylhexyl)phthalate, dinonyl phthalate, dodecyl vdi-lauryl phthalate, and butylbenzyl phthalate; dibasic fatty acid esters, such as dioctyl adipate, butylglycol adipate, dioctyl azelate, dibutyl sebacate, di(2-ethylhexyl)sebacate, and diocyl sebacate; epoxy-modified triglycerides such as epoxy-modified soybean oil; phosphoric acid esters such as tricresyl phosphate, trioctyl phosphate, and triscrolethyl phosphate; and benzoic acid esters such as benzyl benzoate. Further, there are included saturated fatty acids such as caproic acid, enatoic acid, heralgonic acid, capric acid, undecylic acid, lauric acid, tridecylic acid, myristic acid, pentadecylic acid, palmitic acid, heptadecylic acid, stearic acid, nonadecanoic acid, arachic acid, behenic acid, lignoceric acid, cerotic acid, heptacosanoic acid, montanic acid, melissic acid, lacceric acid, and iso-valeric acid; and unsaturated fatty acids such as acrylic acid, crotonic acid, iso-crotonic acid, undecylenic acidpleic acid, elaidic acid, cetoleic acid, nilcaic acid, btecidinic acid, sorbic acid, linolic acid, linolenic acid, arachidonic acid, propiolic acid, stearolic acid, sardine oil, tariric acid, and licanic acid. Of the foregoing, a fatty acid which is liquid at 50° C. is more preferred, one having 5 to 25 carbons is still more preferred, and one having 8 to 21 carbons is most preferred. These lipophilicity-enhancing agents may be used alone or in their combination. The content thereof is preferably 0.01 to 10%, and more preferably 0.05 to 5% by weight, based on the gum. The lipophilicity-enhancing agents may be incorporated through solution in the oil phase of a gum emulsion. Alternatively, they may be solubilized with the aid of a solubilizing agent.

A solid concentration of the gum solution usable in this invention is preferably 5 to 30 g/l. A gum layer thickness can be controlled by conditions of a squeezing means of a processor. A gum coverage is preferably 1 to 10 g/m$^2$. A gum coverage of more than 10 g/m$^2$ necessitates drying the plate surface at a relatively high temperature to complete drying for a short period, which is disadvantageous in terms of cost and safety, and whereby effects of this invention cannot be sufficiently achieved. A gum coverage of less than 1 g/m$^2$ results in non-uniform coating and unstable processability.

In this invention, the time from completion of coating the gum solution to start of drying is preferably 3 sec. or less, and more preferably 2 sec. or less. The shorter time enhances ink affinity.

The drying time is preferably 1 to 5 sec. Effects of this invention cannot be achieved at a drying time of more than 5 sec. A drying time of less than 1 sec. necessitates raising the plate surface temperature to sufficiently dry the lithographic printing plate, leading to disadvantages in cost and safety. Commonly known drying methods using a hot air heater or a far-infrared heater are applicable in this invention. In the drying stage, solvents included in the gum solution need to be dried, necessitating securing sufficient drying temperature and heater capacity. The temperature needed for drying depends on the composition of the gum solution. In the case of the solvent of the gum solution being water, for example, the drying time is preferably 55° C. or more. The capacity is preferably at least 2.6 kW in a hot air drying system. A larger capacity is desirable and a capacity of 2.6 to 7 kW is preferred in balance with cost.

Washing solution used in this invention usually employs water and may optionally be added with the following additives.

There are used chelating compounds which are capable of forming a chelate compound through coordination-bonding with a metal ion. Examples of chelating agents include ethylenediaminetetraacetic acid and its potassium and sodium salts, ethylenediaminedisuccinic acid and its potassium and sodium salts, triethylenetetraminehexaacetic acid and its sodium and potassium salts, diethylenetriaminepentaacetic acid and its sodium and potassium salts, hydroxyethylethylenediaminetriacetic acid and its sodium and potassium salts, nitrilotriacetic acid and its sodium and potassium salts, 1-hydroxyethane-1,1-diphosphonic acid and its sodium and potassium salts, aminotri(methylenephosphonic acid) and its sodium and potassium salts and phosphonoalkanetricarboxylic acid. Besides the foregoing sodium and potassium salts of chelating agents, organic amine salts are also effective. These chelating agents are contained in an amount of 0 to 3.0% by weight.

Surfactants usable in this invention include any one of anionic, nonionic, cationic and amphoteric surfactants, and anionic and nonionic surfactants are preferably used. The kind of preferred surfactants is different depending on the composition of an over-coat layer or photosensitive layer. In general are preferred surfactants which are capable of promoting dissolution of material used in the over-coat layer and exhibit less solubility for components of the photosensitive layer.

Examples of anionic surfactants include fatty acid salts, abietic acid salts, hydroxyalkanesulfonates, alkanesulfonates, dialkylsulfosuccinates, straight chain alkylbebzenesulfonates, branched alktlbebzenesulfonates, alkylnaphthalenesulfonates, alkylphenoxypolyoxyethylene propylsulfonates, polyoxyethylene alkylsulfophenyl ether, polyoxyethylene aryl ether sulfonic acid salts, polyoxyethylene-naphthyl ether sulfonic acid salts, N-metyl-N-oleyltaurine sodium salts, petroleum sulfonic acid salts, nitrated castor oil, sulfated tallow oil, fatty acid alkyl ester sulfuric acid ester salts, alkylnitrates, polyoxyethylene alkyl ether sulfuric acid ester salts, fatty acid monoglyceride sulfate ester salts, polyoxyethylene alkylphenyl ether sulfuric acid salts, alkylphosphate ester salts, polyoxyethylene alkyl ether phosphoric acid ester salts, polyoxyethylene alkylphenyl ether phosphoric acid ester salts, partially saponified styrene anhydrous maleic acid copolymer, partially saponified olefin-anhydrous maleic acid copolymer, and naphthalenesulfonate formaline condensates. Of the foregoing, dialkylsulfosuccinates, alkylsulfates and alkylnaphthalenesulfonates are preferred.

Examples of nonionic surfactants include polyoxyethylene alkyl ethers, polyoxyethylene alkylphenyl ethers, polyoxyethylene-polyoxypropylene block polymers, polyoxyethylene aryl ethers, polyoxyethylene naphthyl ethers, polyoxyethylene polystyrylphenyl ethers, polyoxyethylene polyoxypropylene alkyl ethers, glycerin fatty acid partial esters, sorbitan fatty acid partial esters, pentaerythritol fatyy acid partial esters, propylene glycol monofatty acid esters, sugar fatty acid partial esters, polyoxuethylen sorbitan fatty acid partial esters, polyoxyethylene sorbitol fatty acid partial esters, polyethylene glycol fatty acid partial esters, polyglycerin fatty acid partial esters, polyoxyethylene-modified caster oils, polyoxyethylene grycerin fatty acid partial esters, fatty acid diethanolamides, N,N-bis-2-hydroxyalkylamines, polyoxyethylene alkylamine, triethanolamine fatty acid esters and trialkylamineoxides. The surfactant is contained preferably in an amount of 0 to 10% by weight. The surfactant may be used in combination with defoaming agents.

Antiseptics usable in this invention include, for example, phenol and its derivatives, formaline, imidazole derivatives, sodium dehydroacetate, 4-isothiazoline-3-one derivatives, benzoisothiazoline-3-one, benzotriazole derivatives, amidinoguanine derivatives, quaternary ammonium salts, derivatives of pyridine, quinoline and guanine, diazine, triazole derivatives, oxazole, and oxazine derivatives.

In washing, a washing solution used prior to development is used preferably at a controlled temperature, and more preferably at 10 to 60° C. Washing can be performed using commonly known solution-feeding techniques such as spraying, squeezing roll and submerged shower in a dipping treatment. After completion of the washing stage prior to development, development may be immediately conducted, or drying may be conducted after the washing stage, subsequently, development may be performed. The development stage is followed by a post-treatment such as washing, rinsing or a gumming treatment. Washing water used prior to development may also be reused as washing water or for a rinse solution or gumming solution.

A photopolymerization type photosensitive composition which constitutes the photosensitive layer of the lithographic printing plate according to this invention is composed of an ethylenically unsaturated monomer, a photopolymerization initiator (hereinafter, also denoted simply as a photoinitiator) and a polymeric binder as indispensable components, and a variety of compounds, such as a coloring agent, a plasticizer and a thermal polymerization inhibitor may optionally be used.

The ethylenically unsaturated monomer is referred to as a compound having an ethylenically unsaturated bond, which is capable of undergoing addition polymerization by interaction with a photopolymerization initiator to perform cross-linking or hardening when the photopolymerization type photosensitive composition is exposed to actinic rays. Such a compound having an ethylenically unsaturated bond, capable of undergoing addition polymerization can optimally be selected from compounds containing at least one (preferably at least two) terminal ethylenically unsaturated bond. Examples thereof include various chemical forms, such as a monomer, a pre-polymer (e.g., dimer, trimer, oligomer) and a their mixture or copolymer.

Ethylenically unsaturated monomers usable in this invention include amides of unsaturated carboxylic acids (e.g., acrylic acid, methacrylic acid, itaconic acid, crotonic acid, isocrotonic acid, maleic acid) and amides of unsaturated carboxylic acids and aliphatic polyamine compounds are preferred. Unsaturated carboxylic acid esters which contain a nucleophilic substituent such as hydroxy, amino or mercapto group, and an addition product of amides and monofunctional or polyfunctional isocyanates are also suitably used in this invention. An addition product of isocyanate group-containing unsaturated carboxylic acid esters or amides and monofunctinal or polyfunctional alcohols, amines or thiols; and a substitution product with mono- or poly-functional amines containing a leaving substituent group such as a halogen group or tosyloxy group are also suitably usable. In place of the foregoing unsaturated carboxylic acids, compounds replaced by an unsaturated phosphonic acid, styrene or vinyl ether are also usable.

A specifically preferred addition polymerizable compound containing at least one ethylenically unsaturated bond is a urethane type addition-polymerizable compound prepared through the addition reaction of isocyanate and hydroxy group. Specific examples of such a compound include a vinylurethane compound containing at least two polymerizable vinyl group, which is obtained by causing a polyisocyanate compound containing at least two isocyanate groups (e.g., described in JP-B No. 48-41708) to undergo addition to a hydroxy-containing vinyl monomer, represented by the following formula (2):

CH$_2$=C(R)COOCH$_2$CH(R')OH     formula (2)

wherein R and R' are each H or CH$_3$.

There are also cited urethane (metha) acrylates described in JP-A No. 51-37193 and JP-Nos. 2-32293 and 2-16765 (hereinafter, the term, JP-B refers to Japanese Patent Publications) urethane compounds having an ethylene oxide skeleton described in JP-B Nos. 58-49860, 56-17654, 62-39417 and 62-39418. Specifically preferred examples thereof include compounds, as shown below, which are reaction products of polyisocyanata compounds of group (1) and alcohol compound of group (2).

Group (1)

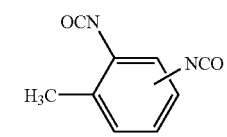

(-NCO: 2,4 - or 2,6-substitution)

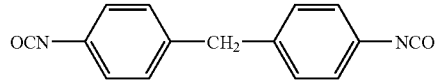

n = 0 or integer of 1 or more

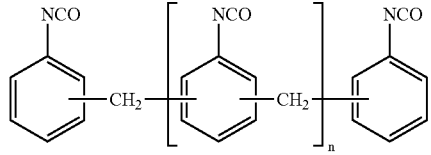

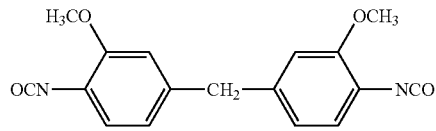

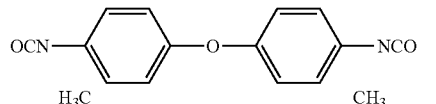

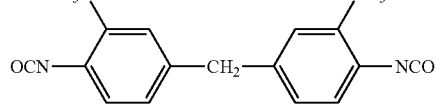

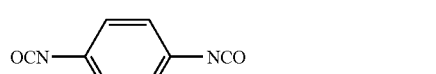

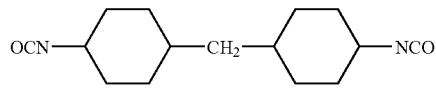

-continued

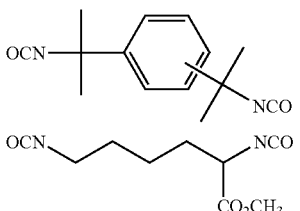

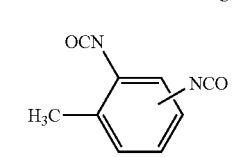

(-NCO: 2,4 - or 2,6-substitution)

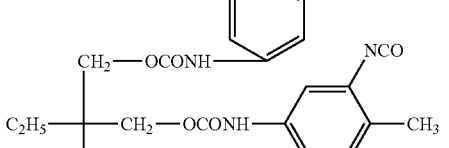

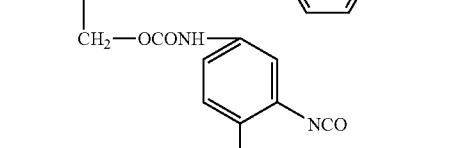

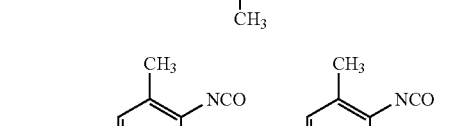

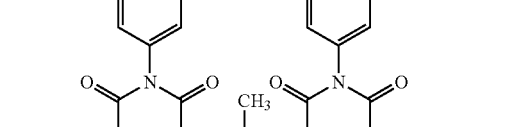

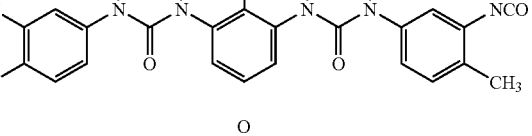

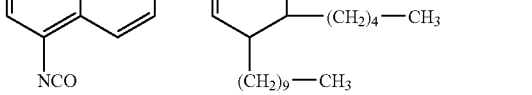

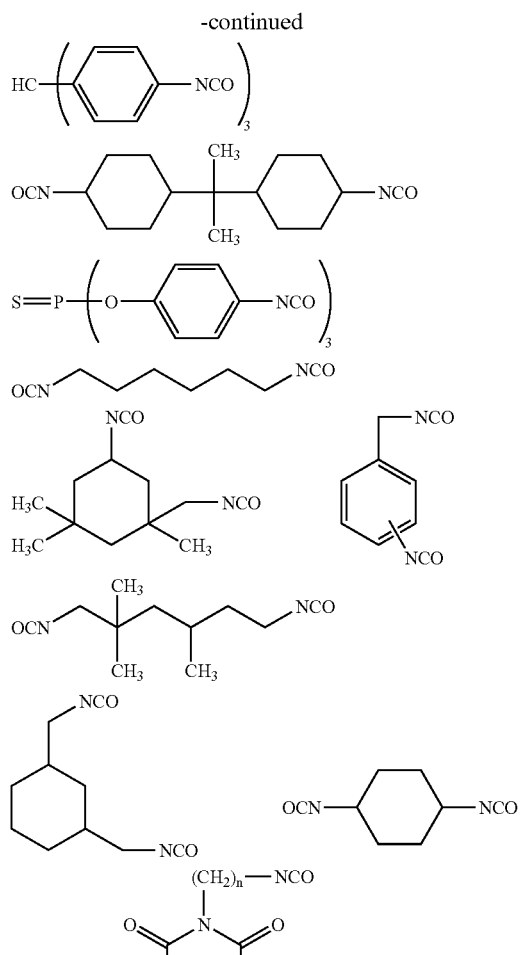

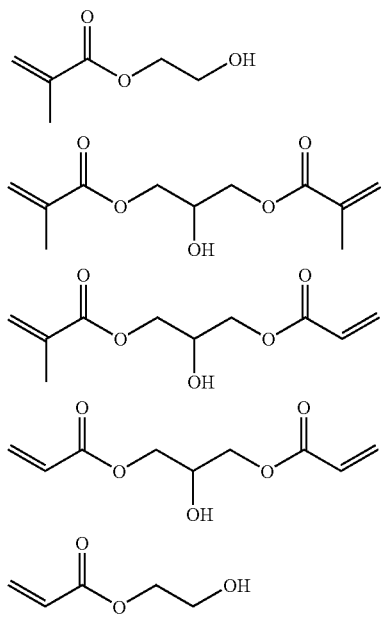

Group (2)

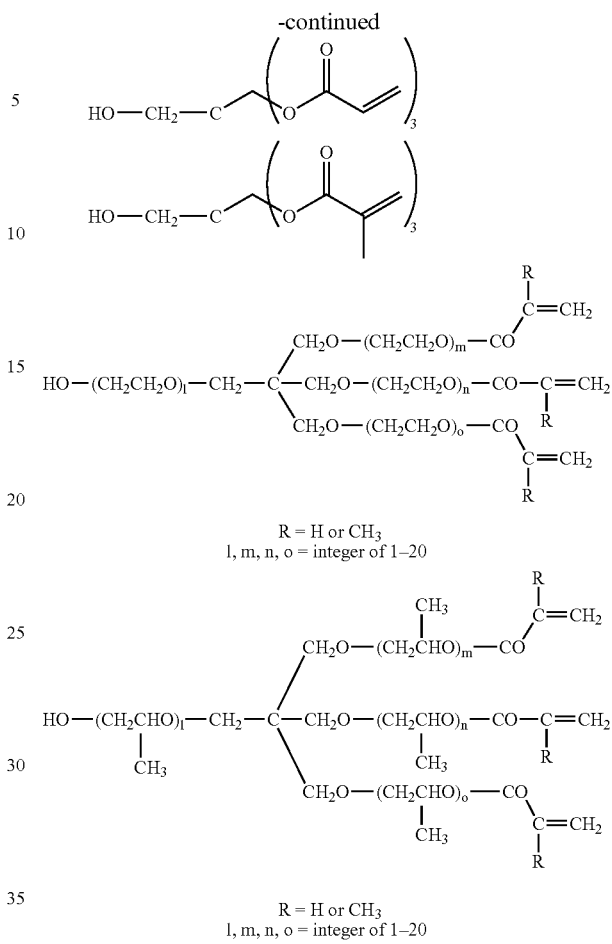

R = H or CH$_3$
l, m, n, o = integer of 1–20

R = H or CH$_3$
l, m, n, o = integer of 1–20

Further, specific compound are as follows: urethaneacrylate M-1100, M-1200, M-1210, and M-1300, available from Toa Gosei Co., Ltd.; urethaneacrylate EB210, EB4827, EB6700, EB220, available from DAICEL UCB Co., Ltd.; UVITHAN-782, UVITHAN-783, UVITHAN-788, and UVITHAN-893, available from MORTON THIOKOL Inc.; Art Resin UN-9000EP, Art Resin UN-9200A, Art Resin UN-900H, Art Resin UN-1255, Art Resin UN-5000, Art Resin UN-2111A, Art Resin UN-2500, Art Resin UN-3320HA, Art Resin UN-3320HB, Art Resin UN-3320HC, Art Resin UN-3320HS, Art Resin UN-6060P, Art Resin UN-6060PTM, Art Resin SH-380G, Art Resin SH-500and Art Resin SH-9832, available from Negami Kogyo Co., Ltd.; NK Oligo U-4H, NK Oligo U-4HA, NK Oligo U-4P, NK Oligo U-4PA, NK Oligo U-4TX, NX Oligo U-4TXA, NE Oligo U-6LHA, NK Oligo U-6LPA-N, NK Oligo U-6LTXA, Nk Oligo UA-6ELP, NK Oligo UA-6ELH, NK Oligo UA-6ELTX, NK Olig UA-6PLP, NK Oligo U-8MD, NK Oligo U-12LMA, NK Oligo U-12LM, NK Oligo 6HA, NK Oligo 108A, NK Oligo U-1084A, NK Oligo U-200AX, NK Oligo U-122A, NK Oligo U-340A, NK Oligo U-324A, and NK Oligo UA-100, available from Shi-Nakamura Kagaku Co., Ltd.; AH-600, At-600, UA-306H, AI-600, UA-101T, UA-101I, UA-101H, UA-306T, UA-306I, UF-8001, UF-8003, available from Kyoei Kagaku Co., Ltd.

Specific examples of the foregoing amide monomer of a aliphatic polyamine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide. In addition, preferred amide monomers include for example, those having a cyclohexylene structure, as described in JP-B No. 54-21726.

Further, ethylenically unsaturated monomers usable in this invention include reaction produces of a monoisocyanate or diisocyanate and a partial ester of a polyhydric alcohol, as described in West German Patent Nos. 2,064,079A, 2,361,041A and 2,822,190A. There are also suitably usable unsaturated compounds containing a photoxidizing group, such as a thio group, ureido group or urethane group, which may take a in formation of a heterocyclic ring, e.g., triethanolamine group, triphenylamino group, thioureido group, imidazole group, oxazole group, thiazole group, N-phenylglycine group, ascorbic acid group. Such compounds are described in European Patent No. 287,818A, 353,389A and 384,735A. Of the compounds described therein, those which contain a tertiary amino group, ureido group or urethane group are preferred. These unsaturated compounds may be used alone or in their combination, or may be mixed with a commonly known unsaturated compound such as an ester monomer of a polyhydric alcohol and an unsaturated carboxylic acid.

Monomers of an ester of an aliphatic polyhydric alcohol and unsaturated carboxylic acid include, for example, an acrylic acid ester, methacrylic acid ester, itaconic acid ester, crotonic acid ester, isocrotonic acid ester, maleic acid ester. Specific examples of acrylic acid ester include ethylene glycol diacrylate, triethylene glycol diacrylate, 1,3-butanedioldiacrylate, tetramethyleneglycol diacrylate, propylene glycol diacrylate, neopentylglycol diacrylate, trimethylolpropanetriacrylate, trimethylopropanetri(acryloyloxypropyl)ether, trimethyloethanetriacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanulate, and polyesteracrylate oligomer.

Specific examples of a methacrylic acid ester include teramethylene glycol dimethacrylate, triethylene glycol dimethacrylate, neopentyglycol dimethacrylate, trimethylopropane trimethacrylate, trimethyloletane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane, and bis-[p-methacryloxyethoxy]phenyl]dimethylmethane.

Specific examples of an itaconic acid ester include ethylene glycol itaconate, propylene glycol itaconate, 1,3-butanediol diitaconate, 1,4-butanediol diitaconate, tetramethylene glycol diitaconate, pentaerythritol diitaconate, and sorbitol tetraitaconate. Specific examples of a crotonic acid ester include ethylene glycol dicrotonate, tetramethylene glycol dicrotonate, pentaerythritol dicrotonate, and sorbitol tetracrotonate. Specific examples of an isocrotonic acid ester include ethylene glycol diisocrotonate, pentaerythritol diisocrotonate, and sorbitol tetraisocrotonate.

Specific examples of a maleic acid ester include ethylene glycol dimaleate, triethylene glycol dimaleate, pentaerythritol dimaleate, and sorbitol tetramaleate. There are further cited polyfunctional acrylates and methacrylates, such as polyester acrylates and epoxyacrylate obtained by reaction of epoxy resin with (metha)acrylic acid, as described in JP-A No. 48-64183 and JP-B Nos. 49-43191 and 52-30490. There are also usable phot-hardenable monomers and oligomers, described in "Nippon Sechaku Kyokai-shi", vol. 20, No. 7, page 300t308 (1984). The foregoing ethylenically unsaturated monomers are used in an amount of 5 to 80%, and preferably 30 to 70% by weight, based the photosensitive layer including the total components.

Photopolymerization initiators which are contained in the photosensitive layer of the lithographic printing plate according to this invention are usable by optimum selection of a variety of photinitiators known in patent documents or literature or the combined use of at least two initiators (photoinitiator system) according to the wavelength used. Specific examples are described below but are by no means limited to these. In the case of employing light sources such as visible rays of 400 nm or more, Ar laser, second harmonic of semiconductor lasers and SHG-YAG laser, a variety of photoinitiators have been proposed, including, for example, a certain kind of photoreducing dyes such as rose bengal, eosine and erythrosine described in U.S. Pat. No. 2,850,445, or a combination of a dye and an initiator such as a compound initiatot system of a dye and amine compound, described in JP-B No. 44-20189; the combined use of hexaarylbiimidazole, a radiaca generating agent and a dye, as described in JP-B No. 45-37377; a combination of hexaarylbiimidazole and p-dialkylaminobenzilidene, described in JP-B No. 47-2528 and JP-A No. 54-155292; a system of a cyclic cis-α-dicarbonyl compound and a dye, described in JP-A No. 48-84183; a system of a cyclic triazine and a merocyanine dye, described in JP-A No. 54-151024; a system of 3-ketocoumalin and a a surfactant, described in JP-A Nos. 52-112681 and 58-15503; a system of a biimidazole, styrene derivative and a thiol, described in JP-A No. 59-140203; a system of an organic peroxide and a dye, described in JP-A Nos. 59-1504, 59-140203, 59-189340, 62-174203, and JP-B No. 62-1641, U.S. Pat. No. 766,055; a system of a dye and an activated halogen compound, described in JP-A Nos. 63-258903 and 2-63054; a system of a dye and a borate compound, described in JP-A Nos. 62-14304462-150242, 64-13140, 64-13141, 64-13142, 64-13143, 64-13144, 64-17048, 1-229003, 1-298348, and 1-138204; a system of a rhodanine ring containing dye and a radical generating agent, described in JP-A Nos. 2-179643 and 2-244050; a system of a titanocene and 3-ketocoumalin, described in JP-A No. 63-221110; a combination system of a titanocene, a xanthene dye and an addition-polymerizable ethylenically unsaturated monomer containing an amino or urethane group, described in JP-A Nos. 4-221958 and 4-219756; a system of a titanocene and a specific merocyanine dye, described in JP-A No. 6-295061; and a system of a titanocene and a dye containing a benzopyrane ring, described in JP-A No. 8-334897.

Recently, a laser at the wavelength of 400 to 410 nm (so-called violet laser) was developed and there has been developed a photoinitiator highly sensitive to the wavelength of 450 nm or less, which is also usable as a photoinitiator in this invention. Examples thereof include a combination of cationic dye/borate described in JP-A No. 11-84647; a combination of cationic dye/titanocene, described in JP-A No. 2000-147763; and a combination of carbazole type dye/titanocene, described JP-A No. 2001-42524. In this invention, the use of titanocene compounds is preferred in terms of sensitivity. There are usable in this invention a variety of titanocene compounds, for example, optimally selected from those described in JP-A Nos. 59-152396 and 61-151197. Specific examples of such titanocene compounds include di-cyclopentadienyl-Ti-di-chloride, di-cyclopentadienyl-Ti-bis-phenyl, di-cyclopentadienyl-Ti-bis-2,3,4,5,6-pentafluorophenyl-1-yl, di-cyclopentadienyl-Ti-bis-2,3,5,6-tetrfluorophenyl-1-yl, di-cyclopentadienyl-Ti-bis-2,4,6-trifluorophenyl-1-yl, di-cyclopentadienyl-Ti-bis-2,6-di-fluorophenyl-1-yl, di-cyclopentadienyl-Ti-bis-2,4-di-fluorophenyl-1-yl, di-cyclopentadienyl-Ti-bis-2,3,4,5,6-pentafluorophenyl-1-yl, di-methylcyclopentadienyl-Ti-bis-2,6-difluorophenyl-1-yl, and di-cyclopentadienyl-Ti-bis-2,6-difluoro-3-(pyl-1-yl)-phenyl-1-yl. It is also known that photo-initiating ability can be further enhanced by optional addition of hydrogen providing compounds, such as thiol compounds, (e.g., 2-mercaptobenzthiazole, 2-mercaptpbenzthiazole, 2-mercaptobenzoxazole) or amine compounds (e.g., N-phenylglycine, N,N-dialkylaminoaromatic alkyl ester) to the foregoing photoinitiator. The photopolymerization initiators described above are used at 0.05 to 100 parts, preferably 0.1 to 70 parts, and more preferably 0.2 to 50 parts by weight, based on 100 parts by weight of ethylenically unsaturated monomer.

Polymeric binder used in the photosensitive layer of the lithographic printing plate of this invention needs to be not only a film-forming material but also soluble in an alkaline developer solution so that organic high polymer compounds are used, which are soluble or swellable in alkaline water. Examples such a high polymer compound include addition polymers with a side-chain containing a carboxylic acid group, as described in JP-A No. 59-44615, JP-B Nos. 54-34327, 58-12577, 54-25957, and JP-A Nos. 54-92723, 59-53836 and 59-71048, such as a methacrylic acid copolymer, acrylic acid copolymer, itaconic acid copolymer, crotonic acid copolymer, maleic acid copolymer and partially esterified maleic acid copolymer.

There are also usable acidic cellulose derivatives with a side-chain containing a carboxylic acid group. In addition, a polymer compound in which a hydroxy-containing addition polymer is added with a cyclic acid anhydride is also usable in this invention. Specifically, of these, [benzyl(metha)acrylate/(metha)acrylic acid/optionally other addition-polymerizable vinyl monomer]copolymer and [ally(metha)acrylate/(metha)acrylic acid/optionally other addition-polymerizable vinyl monomer]copolymer are suitable. Further, water-soluble organic polymers such as polyvinyl pyrrolidone and polyethyleneoxide are usable. An alcohol-soluble polyamide and polyether of 2,2-bis-(4-hydroxyphenyl)-propane and epichlorohydrin are usable to enhance strength of hardened film. Polyurethane resin described in JP-B Nos. 7-120040, 7-120041, 7-1200428-12424, and JP-A No. 63-287944 are also usable in this invention.

Introduction of a radical-reactive group into a side-chain of the foregoing high polymer compounds can enhance strength of hardened film. Examples of such a group include a functional group capable of undergoing addition polymerization, such as ethylenically unsaturated group, amino group or epoxy group; a functional group capable of becoming a radical upon exposure to light, such as a mercapto group, thio group, halogen atom, triazine structure and onium salt structure; and a polar group, such as carboxy group or imido group. Of the foregoing functional groups capable of undergoing addition polymerization, an ethylenically unsaturated group such as acryl group, methacryl group, allyl group or styryl group is preferred, and a functional group selected from an amino group, hydroxy group, phosphone group, phosphonic acid group, carbamoyl group, isocyanate group, ureido group, ureylene group, sulfonic acid group and ammonio group is also useful.

To maintain developability of the composition, a polymeric binder having an optimum molecular weight and acid value is preferred in this invention and a polymeric binder having a weight-average molecular weight of 5,000 to 300,000 and an acid value of 20 to 200 is specifically preferred. An organic high polymer can be mixed at any amount in the whole composition. However, an amount more than 90% by weight results in unsuitable performance, e.g., in image fastness. Thus, the amount is preferably 10 to 90% by weight, and more preferably 30 to 80% by weight. The weight ratio of an ethylenically unsaturated monomer to an organic high polymer (polymeric binder) is preferably within the range of 1/9 to 9/1, more preferably 2/8 to 8/2, and still more preferably 3/7 to 7/3.

In addition to the main components described above, it is desirable to add a mail amount of a thermal polymerization inhibitor to inhibit unwanted thermal polymerization of polymerizable ethylenically monomers in the process of preparation or during storage. Suitable thermal polymerization inhibitors include, for example, hydroquinone, p-methoxyphenol, di-t-butyl-p-cresol, pyrogallol, t-butylcathecol, benzoquinone, 4,4'-thiobis(3-methyl-6-t-butylphenol), N-nitrosophenylhydroxylamine cerium (III) salt, and N-nitrosophenylhydroxylamine aluminum salt. The thermal polymerization inhibitor is added preferably in an amount of 0.01 to 5%, based on solids of the photosensitive layer. Further, to prevent polymerization inhibition by oxygen, fatty acid derivatives such as behenic acid and behenic acid amide may be added to allow to be located on the surface of the photosensitive layer in the stage of drying after coating. Such fatty acid derivatives are added preferably in an amount of ca. 0.5 to 10% by weight, based on solids of the photosensitive layer.

Colorants may be incorporated for the purpose of coloring the photosensitive layer. Such colorants include, for example, pigments such as phthalocyanine type pigments (e.g., C.I. Pigment Blue 15:3 15:4, 15:6), azo type pigments, carbon black, and titanium oxide; and dyes such as Ethyl Violet, Crystal Violet, azo dyes, anthraquinone dyes and cyanine dyes. The dye or pigment is incorporated preferably in an amount of 0.5 to 20%, based on the whole composition. In addition, there may be incorporated additives such as inorganic fillers and plasticizers such as diocyl phthalate, dimethyl phethalate and tricesyl phosphate to improve physical properties of the hardened film. The amount thereof is preferably not more than 10%, based on the whole composition.

The photosensitive layer composition of the lithographic printing plate of the invention is dissolved in various organic solvents in the process of coating the composition onto the support, to be described later. Examples of solvents usable in this invention include acetone, methyl ethyl ketone, cyclohexane, ethyl acetate, ethylene chloride, tetrahydrofuran, toluene, ethylene glycol monomethyl ether, ethylene glycol monoethyl ether, ethylene glycol dimethyl ether, propylene glycol monomethyl ether, ptopylene glycol monoethyl ether, acetylacetone, cyclohexane, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate-3-methoxypropylacetate, N,N- dimethylformamide, dimethylsulfoxide, γ-butylolactone, methyl lactate, and ethyl lactate. These solvent may be used alone or in combination thereof. The concentration of solids contained in a coating solution is suitably 1 to 50% by weight.

The photopolymerizable composition of the photosensitive layer may be added with a surfactant to enhance coating texture. The coverage of the photosensitive layer is preferably 0.1 to 10 g/m$^2$, more preferably, and still more preferably 0.3 to 5 g/m$^2$, in terms of weight after drying.

There is provided an oxygen-impermeable protective layer (overcoat layer) on the photosensitive layer to prevent polymerization inhibition by oxygen. Water-soluble vinyl polymers are preferably contained in the oxygen-impermeable protective layer. Specific examples thereof include polyvinyl alcohol and its partial ester, ether or acetals and copolymer containing a substantially unsubstituted vinyl alcohol unit (e.g., polyvinyl acetal). Polyvinyl alcohols having a saponification degree of 71 to 100 mol % and a polymerization degree of 300 to 2400 are cited. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, each of which are available from KURARAY CO., LTD. There are also included polyvinylacetate chloro-acetate or -propionate, and polyvinylformal, polyvinyl acetal or their copolymer, each having a saponification degree of 88 to 100 mol %. Other useful polymers include polyvinyl pyrrolidone, gelatin and gum arabic, which may be used alone in combination.

Solvents for use in coating an oxygen-impermeable protective layer of the lithographic printing plate of this invention is preferably water, which may be mixed with alcohols such as methanol or ethanol, ketones such as acetone or methyl ethyl ketone. The solid concentration of a coating solution is preferably 1 to 20% by weight. The oxygen-impermeable protective layer may further be added with commonly known additives such as a surfactant to enhance coatability or a water-soluble plasticizer to improve film physical properties. Examples of such a water-soluble plasticizer include propionamide, cyclohexanediol, glycerin, and sorbitol. There may be incorporated water-soluble (metha)acryl type polymer, preferably at a coverage of ca. 0.1 to ca. 15 g/M$^2$ and more preferably 1.0 to 5.0 g/m$^2$, in terms of weight after being dried.

Next, there will be described supports used in the lithographic printing plate according to this invention. Aluminum supports usable in this invention include dimensionally stable aluminum or its alloys (e.g., alloys of silicon, copper, manganese, magnesium, chromium, zinc, lead, bismuth, or nickel), and aluminum or aluminum alloy-laminated or -deposited plastic film or paper. The thicknes of the support is usually 0.05 to 1 mm. There is also usable a composite sheet described in JP-A No. 48-18327.

Aluminum supports used in this invention are subjected to substrate surface treatments, as described below.

Graining Treatment

Graining treatments include mechanical graining, chemical etching and electrolytic graining. Further, there are usable electrochemical graining in which graining is electrochemically performed in an electrolysis solution of hydrochloric acid or nitric acid; and mechanical graining methods such as a wire-brush graining method in which the aluminum surface is scratched with a metallic wire, a ball graining method, in which the aluminum surface is grained with abrasive balls and other abrasive material, and a brush graining method in which the surface is grained with a nylon brush and an abrasive material. The foregoing graining methods may be used alone or in combinations thereof. The surface-roughening method usable in this invention is preferably an electrochemical graining in which graining is electrochemically performed in an electrolysis solution of hydrochloric acid or nitric acid, suitably at a current density of 100 to 400 C/dm$^2$. Specifically, electrolysis is preferably performed in a 0.1 to 50% hydrochloric acid or nitric acid solution at a temperature of 20 to 100° C. and a current density of 100 to 400 C/dm$^2$ over a period of 1 sec to 30 min.

The thus grained aluminum support is chemically etched with an acid or alkali. The use of an acid as an etching agent is time-consuming to destroy the fine structure, which is disadvantageous for industrial application but an improvement of which can be achieved by using an alkali-etching agent. Suitable alkali reagents usable in this invention include sodium hydroxide, sodium carbonate, sodium aluminate, sodium meta-cinnamic acid, sodium phosphate, potassium hydroxide, and lithium hydroxide. The preferred concentration and temperature are 1 to 50% and 20 to 100° C., respectively, and the aluminum dissolution amount is preferably 5 to 20 g/m$^2$. After completion of etching, acid washing is conducted to remove stains (smut) remaining on the surface. Usable acids include nitric acid, sulfuric acid, phosphoric acid, chromic acid, hydrofluoric acid, and fluoroboric acid. Specifically, preferred smut-removing methods (de-smutting) which are undergone after the electrochemical surface-roughening treatment include a method of bringing the surface into contact with 15 to 65 wt % sulfuric acid at 50 to 90° C., as described in JP-A No. 53-12739 and an alkali-etching method described in JP-B No. 48-28123. The surface roughness (also denoted as Ra) of an aluminum support used in this invention is preferably 0.3 to 0.7 μm.

Anodic Oxidation

The thus treated aluminum support is further subjected to an anodic oxidation treatment. The anodic oxidation treatment can be carried out in accordance with conventional methods known in the art. Specifically, a direct or alternating electric current caused to flow through aluminum in an aqueous or non-aqueous solution of sulfuric acid, phosphoric acid, chromic acid, oxalic acid, sulfamic acid or benzenesulfonic acid alone or in their combination, thereby forming an anodic oxidation film (or oxide layer) on the surface of the aluminum support. The anodic oxidation, which is variable depending on conditions of the electrolysis solution used, is suitably carried out at an electrolyte concentration of 1 to 80%, a solution temperature of 5 to 70° C., a current density of 0.5 to 60 amp./dm$^2$, and a voltage of 1 to 100 V over an electrolysis time of 10 to 100 sec.

Of the foregoing anodic oxidation treatments, anodic oxidation at a relatively high current density in sulfuric acid, as described in British Patent No. 1,412,768 and anodic oxidation conducted in a phosphoric acid electrolysis bath, as described in U.S. Pat. No. 3,511,661 are preferable. In this invention, the anodic oxidation film thickness is preferably 1 to 10 g/m$^2$. A film thickness of less than 1 g/m$^2$ easily allows flaws to form on the printing plate, and a film thickness of more than 10 g/m$^2$ needs a large amount of electric power and is economically disadvantageous. The film thickness is more preferably 1.5 to 7 g/m$^2$ and still more preferably 2 to 5 g/m$^2$.

Further, the aluminum support which has been subjected to the graining and anodic oxidation treatments may optionally be subjected to a sealing treatment of the anodic oxidation film (oxide layer). Sealing of the oxidation film can be conducted by dipping the substrate into hot water or hot water containing inorganic or organic salts or by a steam treatment. The aluminum support may be subjected to a silicate treatment using alkali metal silicates or other treatments, such as a surface treatment by dipping in an aqueous solution containing potassium fluorozirconate or phosphate salts.

On the thus surface-treated aluminum support, the photosensitive layer composed of the photopolymerizable composition described earlier is coated to prepare a lithographic printing plate. Prior to coating the photosensitive layer, there may optionally be provided an organic or inorganic sublayer on the support.

Using conventional actinic rays such as a carbon arc lamp, xenon lamp, metal halide lamp, fluorescent lamp, tungsten lamp, halogen lamp, helium-cadmium laser, argon laser, FD·YAG laser, helium-neon laser or semiconductor laser (350 to 600 nm), the photosensitive layer of the lithographic printing plate is subjected to imagewise exposure, followed by being developed to form images on the aluminum plate support. After imagewise exposure and before development, the lithographic printing plate may be subjected to a heating process at a temperature of 50 to 150° C. over a period of 1 sec to 5 min. to enhance hardening efficiency of the photopolymerizable photosensitive layer.

The oxygen-impermeable overcoat layer described earlier is provided on the photosensitive layer, and there are known a method in which the overcoat layer and the unexposed photosensitive layer are simultaneously removed with a developer relating to this invention and a method in which the overcoat layer is removed with water or hot water, followed by removing the unexposed photosensitive layer in development. The water or hot water may contain an antiseptics described in JP-A No. 10-10754 or organic solvents described in JP-A No. 8-278636.

Using the developer relating to this invention, development of the lithographic printing plate is carried out at a temperature of 0 to 60° C. (preferably 15 to 40° C.) in accordance with conventional manners, for example, in a manner such that the exposed printing plate is dipped into the developer and rubbed off with a brush. In cases when development is carried out using an automatic processor, a developer is exhausted in proportion to the processing volume so that developability can be recovered using a replenisher solution or fresh developer. The thus developed lithographic printing plate is further subjected to post-processing using washing water, a rinse solution containing surfactants or a finisher solution containing gum arabic, as described in JP-A Nos. 54-8002, 55-115045 and 59-58431. The foregoing treatments may be used in combination in the post-processing. The processed printing plate may further be subjected to post-exposure or a heating treatment such as burning to enhance plate life, as described in JP-A No. 2000-89478. The thus obtained planographic printing plate is set onto an offset printing machine employed for high-volume printing.

EXAMPLES

The present invention will be exemplarily described based on examples but the scope of the invention is by no means limited to these.

Example 1

The surface of a 0.30 mm thick 1S aluminum plate was grained by using a nylon brush (#8) and an aqueous 800 mesh permestone suspension and then well washed with water. Subsequently, after dipped in an aqueous 10% sodium hydroxide solution at 70° C. for 60 sec. to perform etching, the plate was washed with running water, neutralized with 20% nitric acid and then washed. The plate was subjected to electrolytic surface roughening in an aqueous 1% nitric acid solution at 300 coulomb/dm$^2$ of a quantity of electricity at the anode, using sine wave alternant current under the condition of VA=12.7 V. The depth of surface roughness (designated as Ra) was determined to be 0.45 μm. Subsequently, after the plate was dipped into an aqueous 30% sulfuric acid solution at 55° C. for 2 min. to perform de-smutting, an anode was arranged onto the grained surface in an aqueous 30% sulfuric acid solution at 33° C. and anodic oxidation was performed at a current density of 5 A/dm$^2$ for 50 sec. The oxide film thickness was 2.7 g/m$^2$. On the thus treated aluminum plate, the following photopolymerizable composition (1) was coated so as to give a dry coating weight of 1.5 g/m$^2$ and dies at 100° C. for 1 min. to form a photosensitive layer.

| Photopolymerizable composition (1) | |
| --- | --- |
| Ethylenically unsaturated compound (A1) | 1.5 parts |
| Linear organic high polymer (B1) | 2.0 parts |
| Sensitizer (C1) | 0.15 parts |
| Photoinitiator (D1) | 0.2 parts |
| ε-Pthalocyanine (E1) dispersion | 0.02 parts |
| Fluorinated nonionic surfactant (Megafac F177, DAINIPPON IN & CHEMICALS INC.) | 0.03 PARTS |
| Methyl ethyl ketone | 9.0 parts |
| Propylene glycol monoethyl ether acetate | 7.5 parts |
| Toluene | 11.0 parts |

A1

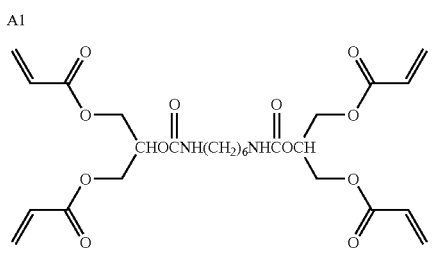

B1

Reaction product of the following:

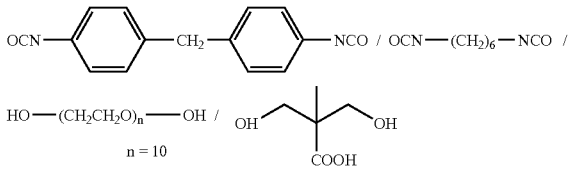

(= 80/20/75/25)

C1

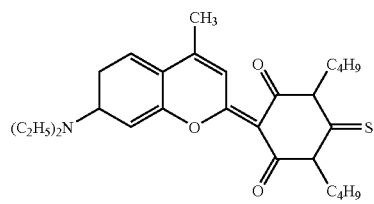

Photopolymerizable composition (1)

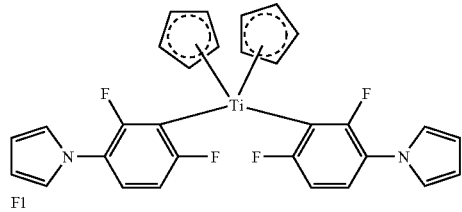

D1

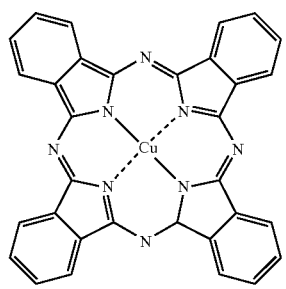

F1

On the thus formed photosensitive layer, an aqueous of 3 wt % polyvinyl alcohol (a saponification value of 98 mol %, a polymerization degree of 500) was coated so as to give a dry coating weight of 2.5 g/m² and dried at 120° C. for 3 min. to obtain a lithographic printing plate.

The thus prepared photopolymerizable lithographic printing plate was image exposed at a resolution of 2540 dpi ("dpi" represents the number of dots per inch or 2.54 cm) using a CTP exposure apparatus, installed with a FD-YAG laser source (Tigercat, available from ECRM Co.). Subsequently, development was conducted using the following developer and gumming solution in a CTP automatic processor (PHW 23-V, available from Technigraph Co.), which was provided with a pre-washing section for removing an oxygen-impermeable layer prior to development, a developing section filled with a developer having the composition described below, a washing section for removing developer attached onto the printing plate surface and a gumming section with a gumming solution for protection of line image areas, having the composition described below. Development was carried out at a developing ttemperature of 28° C. for a dipping developing time of 30 sec. to obtain a planographic printing plate.

Using a developer which was prepared by diluting a developer composition having the following composition with water to make 1 liter, the lithographic printing plate was continuously processed, while replenishing a developer replenishing solution at a rate of 50 ml/m², which was prepared by diluting a developer replenisher concentrate having the following composition with water to make 1 liter. After processing 300 m² of the lithographic printing plate, a evaluation was made in a running developer solution. Further, a developer composition was visually evaluated before and after being diluted with water. Evaluation results are shown in Table 1.

Developer composition (1)

| | |
|---|---|
| Potassium hydroxide | 0.15 g |
| Potassium carbonate | 1.0 g |
| Polyoxyethylene naphthyl ether (n = 13) | 5.0 g |
| Disodium ethylenediaminetetraacetate dihydride | 0.1 g |

Developer composition (2)

| | |
|---|---|
| Potassium hydroxide | 0.15 g |
| Potassium carbonate | 2.0 g |
| Sodium laurate | 1.0 g |
| Polyoxyethylene polyoxypropylene block copolymer (MW: ca. 10,000, EO ratio: 70%) | 3.0 g |
| Disodium ethylenediaminedisuccinate | 0.1 g |

Developer composition (3)*

| | |
|---|---|
| Potassium hydroxide | 0.15 g |
| Potassium carbonate | 1.0 g |
| Polyoxyethylene naphthyl ether (n = 13) | 4.0 g |
| Polyoxyethylene naphthyl ether (n = 13) sodium sulfonate | 1.0 g |
| Disodium ethylenediaminetetraacetate dihydrate | 0.1 g |

*water content: ca. 5%

Developer replenisher composition (1)*

| | |
|---|---|
| Potassium hydroxide | 0.6 g |
| Potassium carbonate | 1.0 g |
| Polyoxyethylene naphthyl ether (n = 13) | 5.0 g |
| Disodium ethylenediaminetetraacetate dihydride | 0.1 g |

(*water content: 0%; silicate content: 0%)

Developer replenisher composition (2)

| | |
|---|---|
| Potassium hydroxide | 0.6 g |
| Potassium carbonate | 2.0 g |
| Sodium laurate | 1.0 g |
| Polyoxyethylene polyoxypropylene block copolymer (MW: ca. 10,000, EO ratio: 70%) | 3.0 g |
| Disodium ethylenediaminedisuccinate | 0.1 g |

(*water content: 0%; silicate content: 0%)

Developer replenisher composition (3)*

| | |
|---|---|
| Potassium hydroxide | 0.6 g |
| Potassium carbonate | 1.0 g |
| Polyoxyethylene naphthyl ether (n = 13) | 4.0 g |
| Disodium ethylenediaminedisuccinate | 0.1 g |
| Polyoxyethylene naphthyl ether (n = 13) sodium sulfonate | 1.0 g |
| Disodium ethylenediaminedisuccinate | 0.1 g |

(*water content: ca. 5%; water content: 0%)

| Comparative developer solution (1)* | |
|---|---|
| Aqueous potassium silicate solution (SiO$_2$: 26 wt %, K$_2$O: 13.5 wt %) | 40.0 g/l |
| Potassium hydroxide | 4.0 g/l |
| Disodium ethylenediaminetetraacetate dihydride | 0.5 g/l |
| Polyoxyethylene naphthyl ether (n = 13) sulfonate | 20.0 g/l |
| Water to make 1 liter | |

*an unconcentrated conventional developer solution
(*silicate content: 1%)

| Comparative developer composition (1)* | |
|---|---|
| Aqueous potassium silicate solution (SiO$_2$: 26 wt %, K$_2$O: 13.5 wt %) | 40.0 g |
| Potassium hydroxide | 4.0 g |
| Disodium ethylenediaminetetraacetate dihydride | 0.5 g |
| Polyoxyethylene naphthyl ether (n = 13) sodium sulfonate | 20.0 g |
| Water | 35.0 g |

(*water content: 60%; silicate content: 10%)

| Comparative developer composition (2)* | |
|---|---|
| Aqueous potassium silicate solution (SiO$_2$: 26 wt %, K$_2$O: 13.5 wt %) | 40.0 g |
| Potassium hydroxide | 4.0 g |
| Disodium ethylenediaminetetraacetate dihydride | 0.5 g |
| Polyoxyethylene naphthyl ether (n = 13) sulfonate | 20.0 g |

Solid composition (water content less than 1%) obtained by drying the foregoing mixture at 60° C. (silicate content: 25%).

| Comparative developer replenisher composition (1)* | |
|---|---|
| Aqueous potassium silicate solution (SiO$_2$: 26 wt %, K$_2$O: 13.5 wt %) | 40.0 g/l |
| Potassium hydroxide | 4.0 g/l |
| Disodium ethylenediaminetetraacetate dihydride | 0.5 g/l |
| Polyoxyethylene naphthyl ether (n = 13) sulfonate | 20.0 g/l |

Remainder is water,
pH: 12.3
(*silicate content: 1%)

| Surface protectant (gumming solution) for 1 liter | |
|---|---|
| White dextrin | 5.0 wt % |
| Hydroxypropy ether-modified starch | 10.0 wt % |
| Gum arabic | 1.0 wt % |
| Ammonium primary phosphate | 0.1 wt % |
| Sodium dilaurylsuccinate | 0.15 wt % |
| Polyoxyethylene naphthyl ether (n = 13) | 0.5 wt % |
| Ethylene glycol | 1.0 wt % |
| Disodium ethyleneglycoltetraacetate | 0.005 wt % |
| Ethyl paraben | 0.005 wt % |

TABLE 1

| Sample No. | Developer Composition | Form | Handling | Appearance After Being Diluted | Imaging | Remark |
|---|---|---|---|---|---|---|
| 1 | Developer composition (1) | paste | light, viscous, not so easy to handle | transparent liquid | *1 | Inv. |
| 2 | Developer composition (2) | powder | light, easy to handle | transparent liquid | *1 | Inv. |
| 3 | Developer composition (3) | paste | light, slightly hard to handle due to viscousness | transparent liquid | *1 | Inv. |
| 4 | Comp. Developer Solution (1) | liquid | heavy, hard to handle | transparent liquid | *1 | Comp. |
| 5 | Comp. Replenisher composition (1) | separation into solid and liquid | light, non-usable*3 | *5 | *2 | Comp. |
| 6 | Comp. Replenisher composition (2) | solid | light, non-usable*4 | *5 | *2 | Comp. |
| 7 | Replenisher composition (1)*6 | paste | light, viscous, not so easy to handle | transparent liquid | *1 | Inv. |
| 8 | Replenisher composition (2)*7 | powder | light, easy to handle | transparent liquid | *1 | Inv. |
| 9 | Replenisher composition (3) | paste | light, slightly hard to handle due to viscousness | transparent liquid | *1 | Inv. |

TABLE 1-continued

| Sample No. | Developer Composition | Form | Handling | Appearance After Being Diluted | Imaging | Remark |
|---|---|---|---|---|---|---|
| 10 | Comp. replenisher concentrate (1)*8 | liquid | heavy, hard to handle | transparent liquid | *1 | Comp. |

*1 normal images were obtained
*2 development trouble occurred
*3 non-usable by separation
*4 non-usable due to solidification
*5 not completely dissolved in water
*6 developer (1) was used at the start of processing
*7 developer (2) was used at the start of processing
*8 comp. developer (1) was used at the start of processing As can be seen from Table 1, it was proved that developer compositions and developer replenisher concentrates according to this invention produced no problem when diluted with water, resulting in normal images.

What is claimed is:

1. A method of processing a lithographic printing plate comprising, on an aluminum plate support, a photosensitive layer which comprises an ethylenically unsaturated monomer, a photopolymerization initiator and a polymeric binder, the method comprising the steps of:
   (a) imagewise exposing the printing plate,
   (b) processing the exposed printing plate with a developer solution using an automatic processor provided with a developing section and a washing section, and
   (c) washing the processed printing plate with washing water,
   wherein the developer solution is obtained by dissolving a developer composition in water, and the developer composition contains water in an amount of not more than 10% by weight and is substantially free from a silicate, and
   wherein the washing water used in step (c) is used to dissolve the developer composition and form the developer solution.

2. The method of claim 1, wherein the developer composition contains water in an amount of not more than 1% by weight.

3. The method of claim 1, wherein the developer composition contains a silicate in an amount of not more than 0.5% by weight converted to $SiO_2$.

4. The method of claim 1, wherein the developer composition comprises an alkali reagent.

5. The method of claim 1, wherein the developer composition is in the form of a paste.

6. The method of claim 1, wherein the developer composition is in the form of powder or granules.

7. The method of claim 1, wherein the developer composition contains a compound represented by the following formula (1):

$$R_1\text{—}O\text{—}(R_2\text{—}O)_n H \qquad \text{formula (1)}$$

wherein $R_1$ is an alkyl group having 3 to 15 carbon atoms, an aromatic hydrocarbon group having 6 to 16 carbon atoms or an aromatic heterocyclic group having 4 to 15 carbon atoms; $R_2$ is an alkylene group having 1 to 100 carbon atoms; and n is an integer of 1 to 100.

8. The method of claim 7, wherein $R_1$ is an aromatic hydrocarbon group having 6 to 16 carbon atoms.

9. A method of processing a lithographic printing plate comprising, on an aluminum plate support, a photosensitive layer which comprises an ethylenically unsaturated monomer, a photopolymerization initiator, and a polymeric binder, the method comprises the steps of:
   (a) imagewise exposing the printing plate;
   (b) processing the exposed printing plate with a developer solution using an automatic processor provided with a developing section and a washing section;
   (c) washing the processed printing plate with washing water, thereby forming used washing water; and
   (d) dissolving in used washing water a developer composition comprising not more than 10% by weight water and substantially free, from silicates, to form the developer solution.

* * * * *